United States Patent
Francisquini (10) Patent No.: US 11,432,646 B2
(45) Date of Patent: Sep. 6, 2022

(54) STRUCTURAL COLUMN AND MODULAR STRUCTURE FOR ELECTRICAL CABINETS INCLUDING REFERRED STRUCTURAL COLUMN

(71) Applicant: Melquisedec Francisquini, Cotia (BR)

(72) Inventor: Melquisedec Francisquini, Cotia (BR)

( * ) Notice: Subject to any disclaimer, the term of this patent is extended or adjusted under 35 U.S.C. 154(b) by 0 days.

(21) Appl. No.: 17/052,810

(22) PCT Filed: May 10, 2019

(86) PCT No.: PCT/BR2019/050176
§ 371 (c)(1),
(2) Date: Nov. 4, 2020

(87) PCT Pub. No.: WO2019/218039
PCT Pub. Date: Nov. 21, 2019

(65) Prior Publication Data
US 2021/0235863 A1  Aug. 5, 2021

(30) Foreign Application Priority Data
May 17, 2018 (BR) .................... BR102018010048-3

(51) Int. Cl.
*A47B 47/02* (2006.01)
*A47B 47/00* (2006.01)
(Continued)

(52) U.S. Cl.
CPC ........ *A47B 47/021* (2013.01); *A47B 47/0008* (2013.01); *A47B 96/1408* (2013.01); *A47B 96/1433* (2013.01); *H05K 7/18* (2013.01)

(58) Field of Classification Search
CPC .............. A47B 47/021; A47B 47/0008; A47B 96/1408; A47B 96/1433; H05K 7/18
(Continued)

(56) References Cited

U.S. PATENT DOCUMENTS 4,643,319 A * 2/1987 Debus ...................... H02B 1/01
                                                   211/189
5,806,946 A   9/1998 Benner et al.
(Continued)

FOREIGN PATENT DOCUMENTS

BR        PI-8406283      10/1985
BR        PI-0303969-2     5/2005
(Continued)

OTHER PUBLICATIONS

Relatorio de Pesquisa Internacional e Opiniao Escrita [International Search Report and the Written Opinion] dated Sep. 24, 2019 From the International Searching Authority Re. Application No. PCT/BR2019/050176 and its Translation of Search Report Into English. (13 Pages).

*Primary Examiner* — Daniel J Troy
*Assistant Examiner* — Timothy M Ayres (57) ABSTRACT

Structural Column and Modular Structure for Electrical Cabinets Comprising said Structural column, includes a structural column (1) which, from a single piece, accurately determines two corners or vertexes of a modular structure (19) for electric cabinets. The modular structure (19) has four vertically positioned structural columns (1) and at least eight horizontal beams (20) connected to each other by means of screws (21). This invention also introduces an innovative joint between the elements of the structural columns (1), which are joined together by means of welds (6) and with the aid of limiters (12), positioning flaps (11) and engagers (9). Thus, this invention guarantees a perfect square of the modular structure and the correct assembly of the electrical cabinet, with no need for highly specialized labor. The modular structure (19) presented here can be manufactured entirely from low-cost metal materials such as (Continued)

carbon steel, significantly reducing the manufacturing costs of electrical cabinets.

14 Claims, 13 Drawing Sheets

(51) Int. Cl.
     *A47B 96/14*      (2006.01)
     *H05K 7/18*      (2006.01)

(58) Field of Classification Search
     USPC .................................................. 312/265.1
     See application file for complete search history.

(56) References Cited

U.S. PATENT DOCUMENTS

| | | | | |
|---|---|---|---|---|
| 5,820,289 | A | 10/1998 | Kern et al. | |
| 6,149,255 | A * | 11/2000 | Benner | H02B 1/301 312/257.1 |
| 6,164,737 | A * | 12/2000 | Benner | H02B 1/01 312/223.1 |
| 6,174,034 | B1 * | 1/2001 | Benner | H02B 1/301 211/26 |
| 6,315,132 | B1 * | 11/2001 | Hartel | H02B 1/301 211/189 |
| 6,428,127 | B1 | 8/2002 | Rasmussen | |
| 6,902,068 | B1 * | 6/2005 | Fontana | H02B 1/01 211/189 |
| 8,091,970 | B2 * | 1/2012 | Francisquini | H02B 1/301 312/265.1 |
| 8,152,403 | B2 * | 4/2012 | Shen | H02B 1/01 403/171 |
| 8,406,283 | B2 | 3/2013 | Utamaru | |
| 10,024,348 | B2 * | 7/2018 | Schindler | H02B 1/014 |
| 2001/0037988 | A1 * | 11/2001 | Knab | H02B 1/01 211/189 |
| 2010/0314982 | A1 * | 12/2010 | Luo | A47B 96/14 312/351.1 |
| 2019/0116972 | A1 * | 4/2019 | Tao | A47B 47/0008 |

FOREIGN PATENT DOCUMENTS

| | | | | |
|---|---|---|---|---|
| BR | PI-0505152-5 | | 8/2006 | |
| EP | 1069661 A1 * | | 1/2001 | ............ H02B 1/301 |
| EP | 1115273 | | 7/2001 | |
| WO | WO-2014111768 A1 * | | 7/2014 | ........... H05K 5/0217 |
| WO | WO 2019/218039 | | 11/2019 | |

* cited by examiner

STRUCTURAL COLUMN AND MODULAR STRUCTURE FOR ELECTRICAL CABINETS INCLUDING REFERRED STRUCTURAL COLUMN

RELATED APPLICATIONS

This application is a National Phase of PCT Patent Application No. PCT/BR2019/050176 having International filing date of May 10, 2019, which claims the benefit of priority of Brazilian Patent Application No. BR 10 2018 010048-3 filed on May 17, 2018. The contents of the above applications are all incorporated by reference as if fully set forth herein in their entirety.

FIELD AND BACKGROUND OF THE INVENTION

The present invention is contained in the field of application of electrical control and energizing devices, more precisely in the field of cabinets and electrical enclosures.

This invention presents an innovative structural column and also a modular structure for electrical cabinets which exhibits various advantages over similar state of the art items, particularly concerning ease of assembly, mechanical strength and a significant reduction in its manufacturing costs.

The electrical cabinets, or enclosures, boxes or panels (as they are also known), are important electrical devices widely used in industry in general.

Their basic function is to energize and/or control equipment, devices, work areas or cells, in industrial plants, adapting to almost all areas of industry, of automation, and/or services.

The electrical cabinets are usually divided into compartments or drawers, which have a diversity of mounted components, for various purposes.

Currently, the state of the art presents several solutions for the manufacture of electrical cabinets. This usually begins with the assembly of a base structure in parallelepipedal shape comprising metal profiles, which serves as a means of supporting the other components of an electrical cabinet, such as doors, crossbars, assembly plates, mechanical, electrical and electronic components, among others.

State-of-the-art solutions involve the welding of all the metal profiles of the base structure or the modular assembly of the metal profiles by other means of fastening, such as screws. Although both solutions have certain advantages, they present disadvantages that are yet to be overcome.

On the one hand, welded structures have great mechanical strength. On the other hand, there are great difficulties in the assembly and transportation of the structure, since it requires specialized labor and cannot be dismantled after welding.

The state-of-the-art solutions that involve a fully modular assembly of the metal profiles present great practicality now in terms of their transport and assembly. However, the corners or vertexes of these base structures for electrical cabinets are, for the most part, manufactured from injected parts of Zamak alloys. Zamak, the name of the metallic alloy that includes zinc, aluminum, magnesium and copper, is well known for its high cost, which is ultimately reflected in the final manufacturing costs of the electrical cabinets.

Still, in general, state-of-the-art solutions regarding correct perpendicular assembly of the metallic profiles of width, depth and height, requiring the use of skilled labor and/or appropriate equipment, have drawbacks. Consequently, assembling electrical cabinets is a daunting task and has high costs.

Patent document PI8406283 introduces a box frame for a distribution cabinet, in which the joining of the corners is through a die-cast connection in Zamak with three fitting points. However, this type of solution has a high cost, besides making it impossible to weld between the metal profiles and the connection, compromising the mechanical stability of said box frame.

Thus, it is evident that the state of the art would benefit from the introduction of modular cabinet structures with high mechanical strength and stability. Still, the state of the art would benefit from modular structures with practical, quick and safe assembly, manufactured from low-cost metal alloys.

OBJECTIVES SUMMARY OF THE INVENTION

The present invention has as its objective to introduce an innovative structural column whose fitting elements are attached to the vertical profile forming a single body, particularly suitable for the assembly of modular structures for electrical cabinets.

Furthermore, the present invention has as its objective to present a modular structure for electric cabinets of simple assembly and high mechanical strength, implemented from the aforementioned structural column.

Another objective of the present invention resides in the introduction of an innovative junction between the components of the modular structure for electrical cabinets, which ensures that the assembly of this modular structure is carried out with practicality and perfectly square.

Also the objective of the present invention is to present a fastening system based on coupling elements containing assembly engagers as well as a support system and screw.

The objectives of the present invention are achieved by the introduction of a structural column which, from a single piece, accurately determines two corners or vertexes of a modular structure for electrical cabinets. This configuration is possible thanks to the introduction of innovative coupling elements, present in the structural columns.

The objectives of the present invention are achieved by the introduction of a modular structure for electrical cabinets, which comprises at least four vertically positioned structural columns and at least eight horizontal beams. The structural columns and the horizontal beams are joined together by means of the fitting elements.

The objectives of the present invention are also achieved by the introduction of an innovative joint between the fitting elements of the structural columns, which are joined together by means of welds and with the aid of limiters, positioning tabs, and engagers. Thus, this invention guarantees a perfect square of the modular structure and the correct assembly of the electrical cabinet, with no need for specialized labor.

The objectives of the present invention are further achieved by the introduction of coupling elements containing assembly engagers, which are provided with the introduction of a support connecting the horizontal beams in order to guide them to the correct assembly position, this support being secured by means of two screws.

Finally, the objectives of this invention are achieved by introducing a modular structure that can be manufactured entirely from low-cost metal materials such as carbon steel, significantly reducing the manufacturing costs of electrical cabinets.

BRIEF DESCRIPTION OF THE SEVERAL VIEWS OF THE DRAWINGS

The subject matter of this Invention will be completely clear in its technical aspects from the detailed description which will be made based on the figures below, in which.

DESCRIPTION OF SPECIFIC EMBODIMENTS OF THE INVENTION

In accordance with what the above mentioned figures illustrate, the present patent application presents in its preferred embodiment a structural column (1) which comprises two fitting elements for joining horizontal beams, hereinafter called engaging elements, (2) arranged symmetrically at the ends of said structural columns, (1) connected by means of a vertical profile (3), welded to the fitting elements (2). From a single piece, the structural columns (1) determine two corners or vertexes of a modular structure (19) of electrical cabinets, unlike any construction that is known in the state of the art.

Each fitting element (2) comprises a structural dowel (4) and two coupling elements (5) perpendicularly arranged in relation to the structural dowel (4). In a fitting element (2), the coupling elements (5) are attached to the structural dowel (4) by means of welds (6) made in the areas of contact between said pieces.

Figure 14:
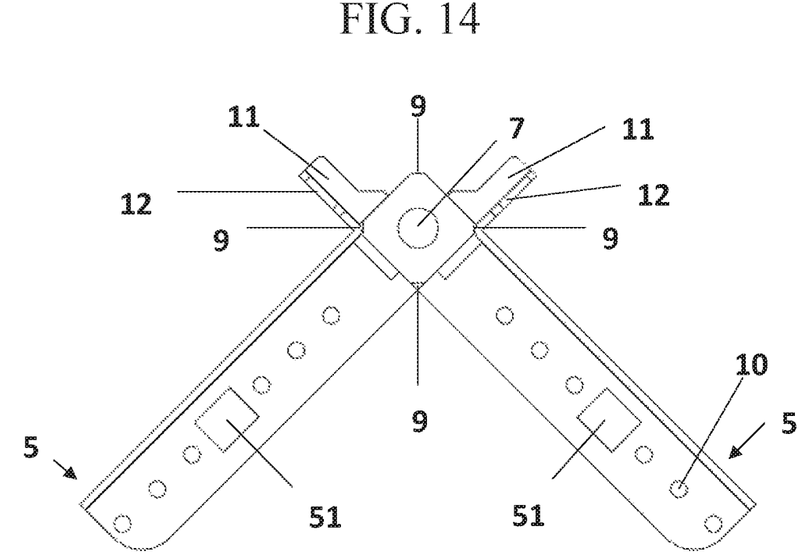
FIG. 14 shows a top view in cross-section of a fitting element.
Figure 15:
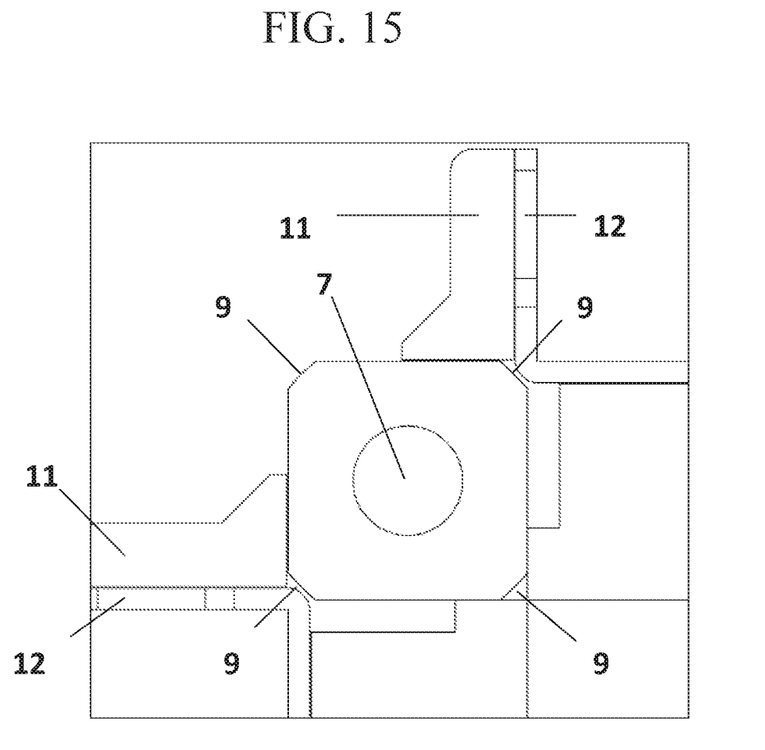
FIG. 15 shows an approximate top view in cross-section of the connection between the structural dowel and the coupling elements.
Figure 16:
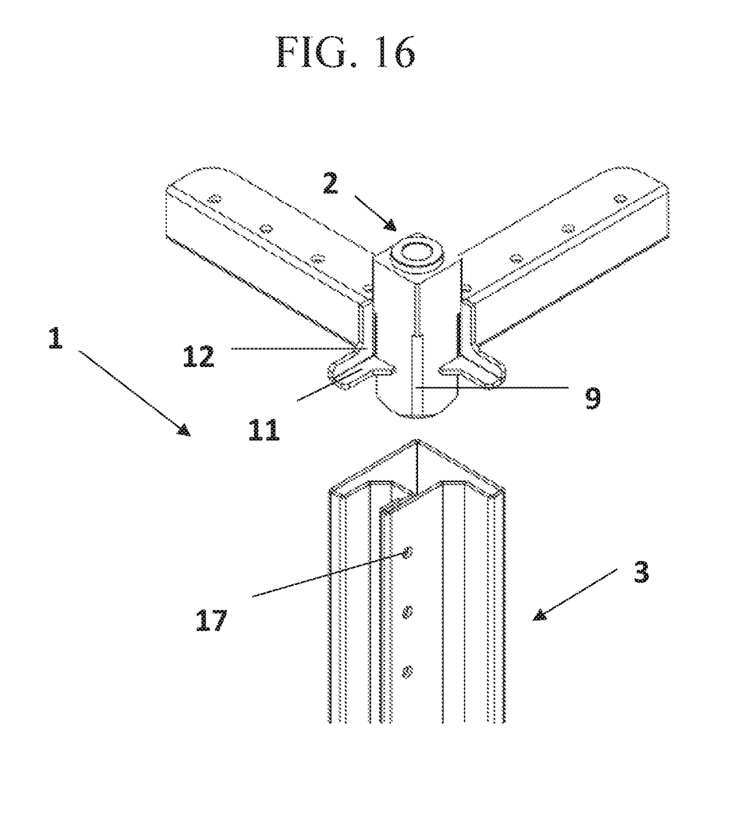
FIG. 16 shows an approximate exploded rear view of a structural column.
Figure 17:
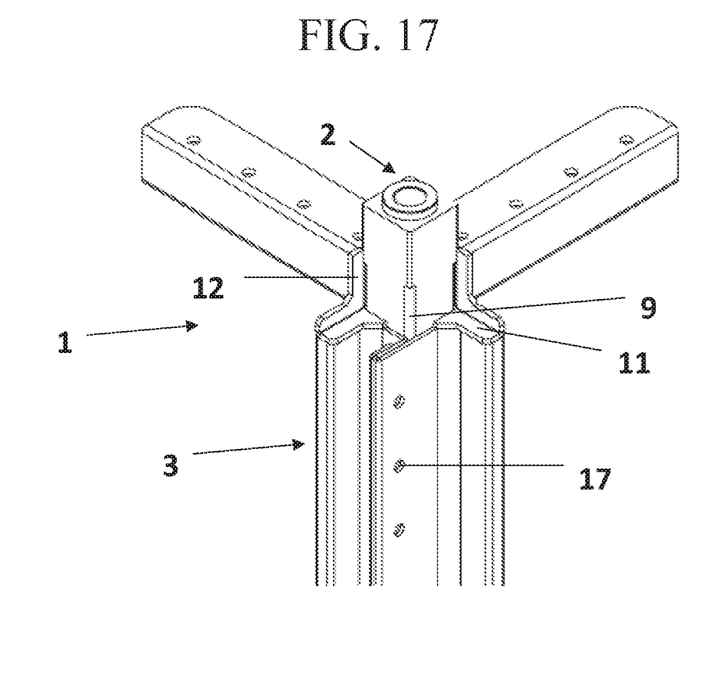
FIG. 17 shows an approximate rear view of a structural column.
Figure 18:
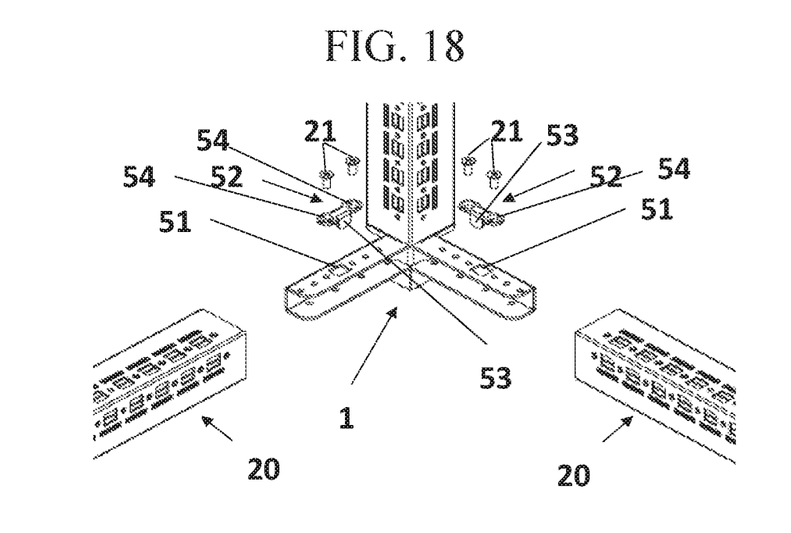
FIG. 18 shows an approximate exploded rear view of the connection between a structural column and two horizontal beams.
Figure 19:
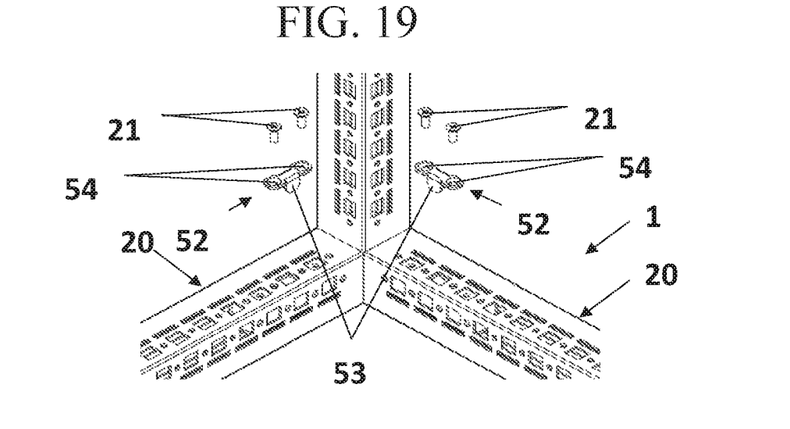
FIG. 19 shows an approximate view of the connection between a structural column and two horizontal beams.
Figure 20:
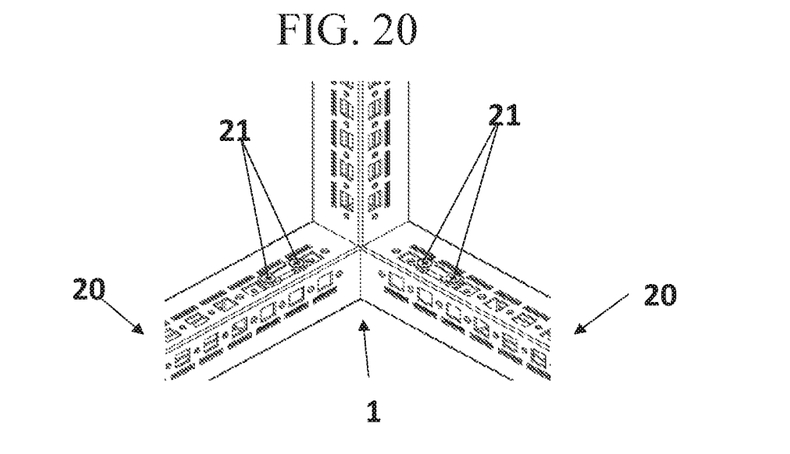
FIG. 20 shows an approximate view of the fitting between a frame column and two horizontal beams.

A structural dowel (4), component part of a fitting element (2), comprises a part in a substantially parallelepipedal shape, provided with a blind bore (7) in its upper portion. The region surrounding the blind bore (7) of the structural dowel (4) has a circular elevation (8). The lower portion of the structural dowel (4) has a flat face with rounded vertexes. The central portion of the structural dowel (4) has four engagers (9), i.e., cuts at 45° that create areas compatible for the accommodation of the coupling elements (5), allowing a perfect square and subsequent welding of these components, as seen in FIGS. 14 and 15. The engagers (9) are located on the vertical edges of the structural dowel (4), i.e., at the intersections between the side and front faces and at the intersections between the side and rear faces.

A coupling element (5), another component part of a fitting element (2), comprises a "C" shaped, stamped part. Both the upper face and the lower face of the coupling element (5) have bores (10) that are evenly distributed along its length. At one end, the coupling element (5) has an "L" shaped, positioning flap (11), coplanar with the lower face of said coupling element (5), and a limiter (12), also "L" shaped, perpendicularly disposed relative to the positioning flap (11). The positioning flap (11) has the function of assisting in the perpendicular positioning and the connection between the coupling element (5) and the structural dowel (4), ensuring correct assembly of the modular structure (19) without the need for highly skilled labor or sophisticated miter equipment. The limiter (12) has the function of restricting the free movement of horizontal beams (20) during assembly of the modular structure (19), ensuring perfect arrangement between said horizontal beams (20) and the structural columns (1). The positioning flap (11) and the limiter (12) must have sufficient area for sealing the rectangular frames (14, 24) of the vertical profiles (3) and of the horizontal beams (20), respectively, which are described in detail below. The coupler element (5) has an assembly slot on its upper side (51) in a square format, the latter being close to its central portion. Said assembly slot (51) has the function of receiving a communicator element (52) which has a lower assembly flap (53) and two assembly holes (54), opposite to each other. Said communicator element (52) connects the horizontal beams (20) so that the lower assembly flap (52) fits into one of the respective square holes, consequently aligning, from the rear fitting with the assembly slot (51), the circular bores of the horizontal beams (20) the bores of the coupling element (5), assuring the assembly of the structure by means of two screws connecting the communicator element (52) to the horizontal beams (20) and the coupling element (5).

Figure 1:
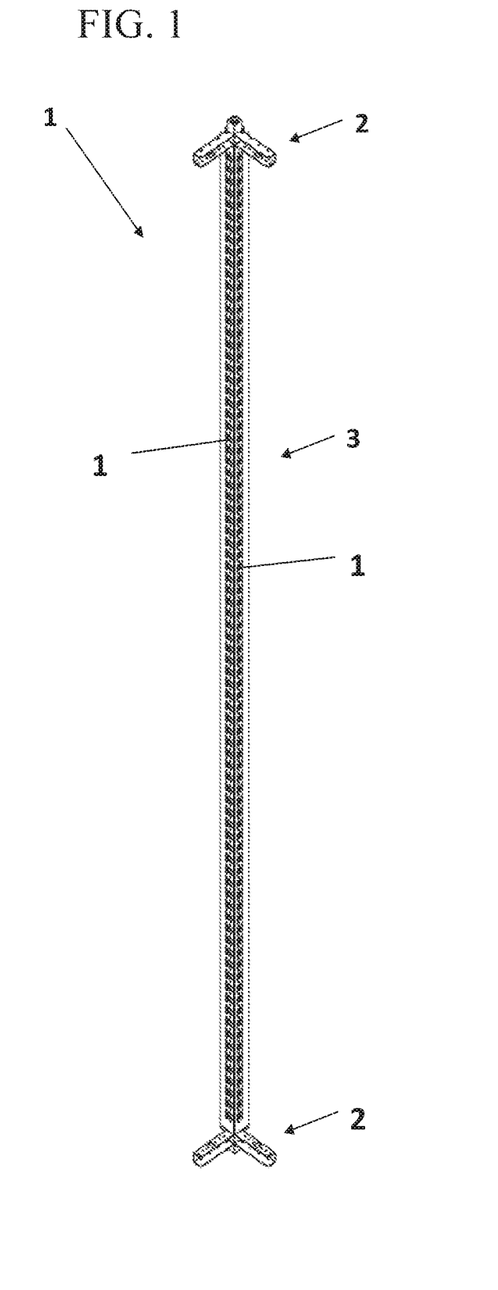
FIG. 1 shows a front view of a structural column.
Figure 2:
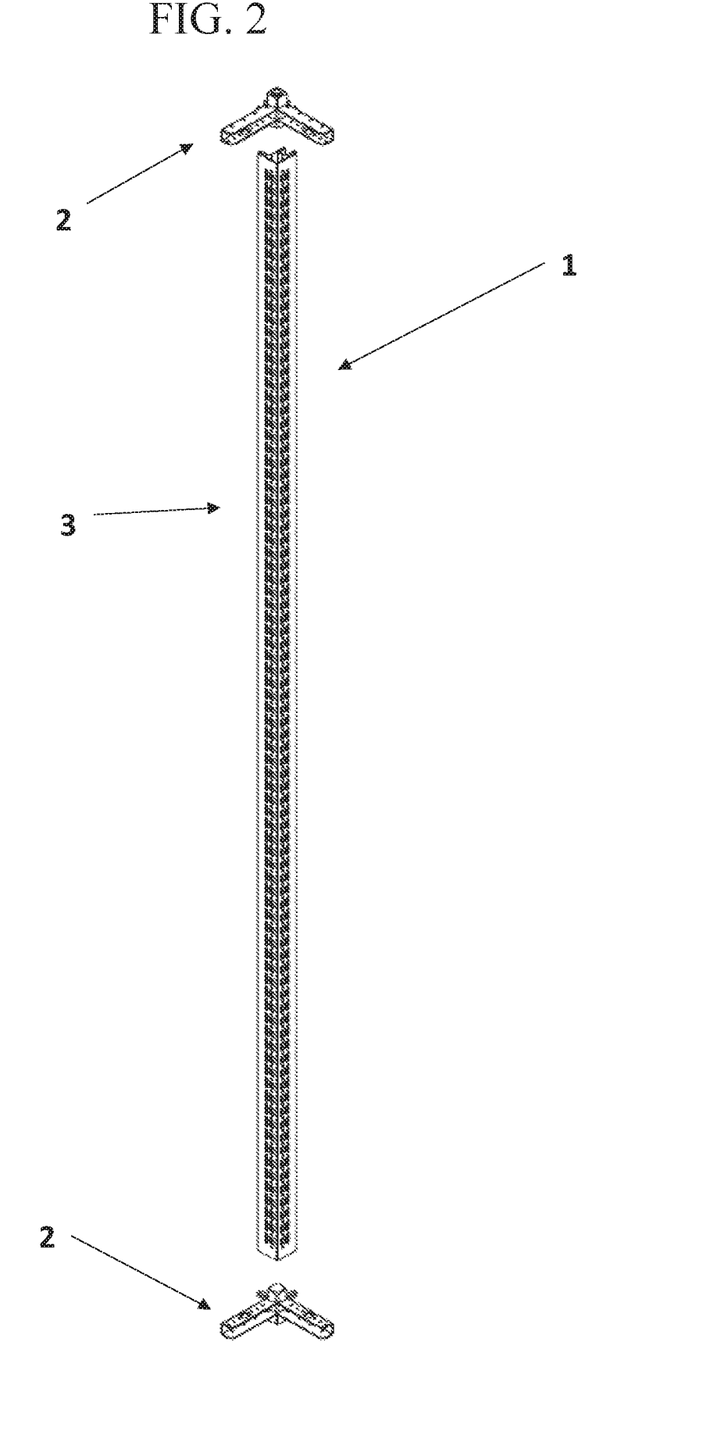
FIG. 2 shows an exploded front view of a structural column.
Figure 3:
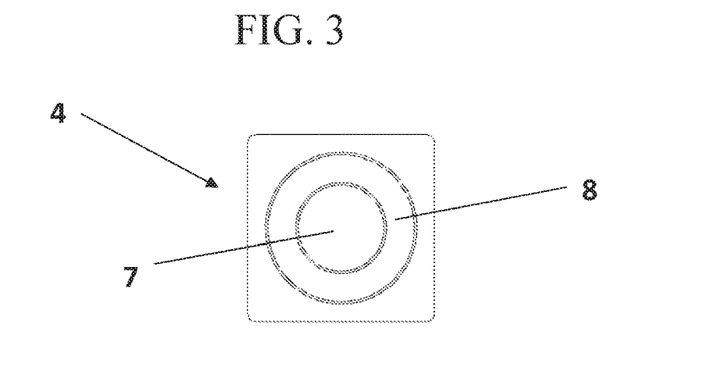
FIG. 3 shows a top view of a structural dowel.
Figure 4:
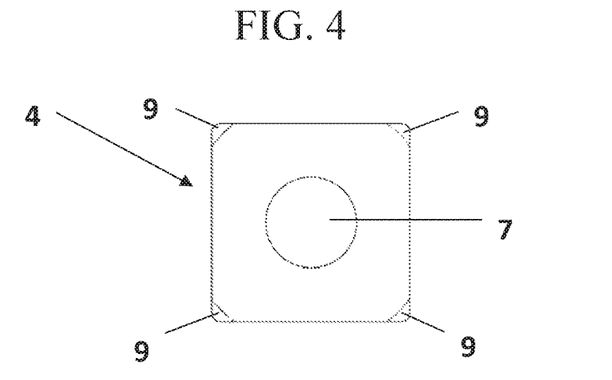
FIG. 4 shows top view in cross-section of a structural dowel.
Figure 5:
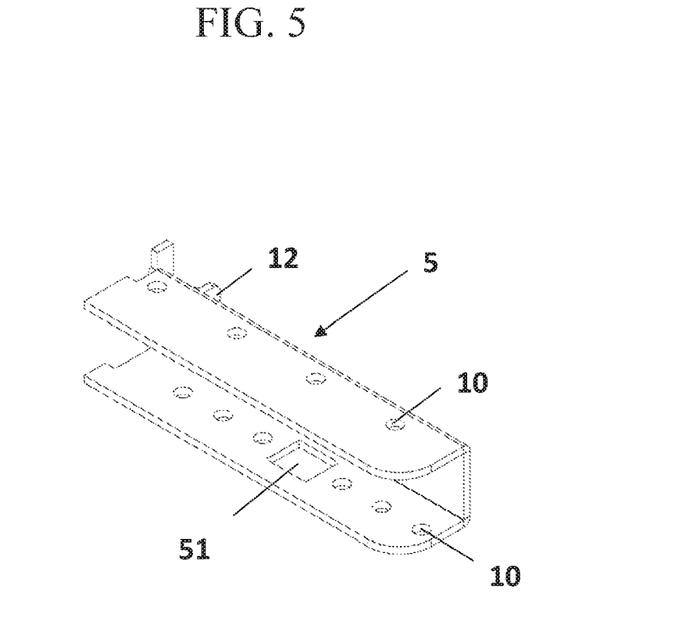
FIG. 5 shows a front view of a coupling element.
Figure 6:
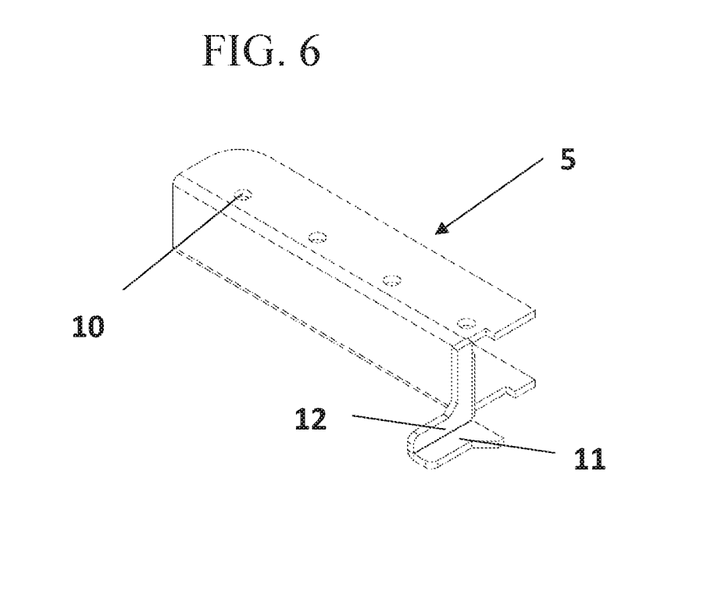
FIG. 6 shows a rear view of a coupling element.
Figure 7:
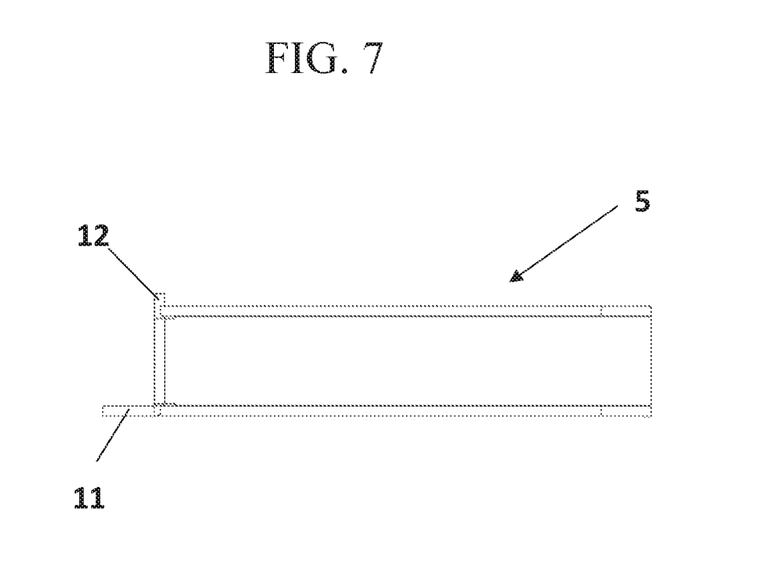
FIG. 7 shows a front view of a coupling element.
Figure 8:
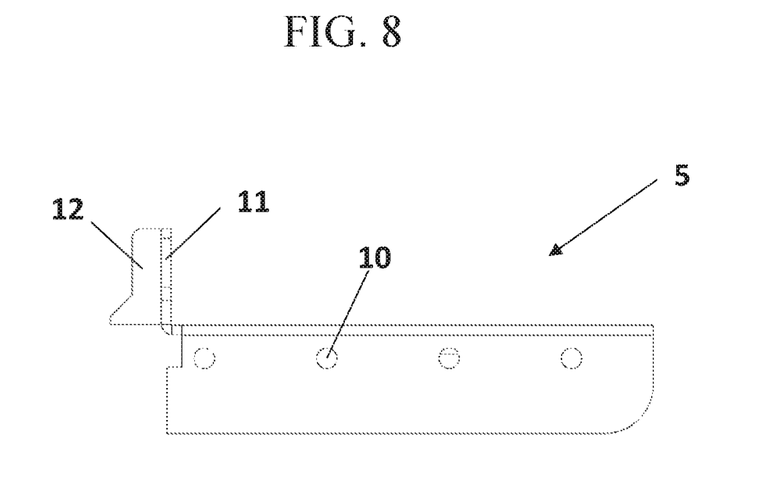
FIG. 8 shows a top view of a coupling element.
Figure 9:
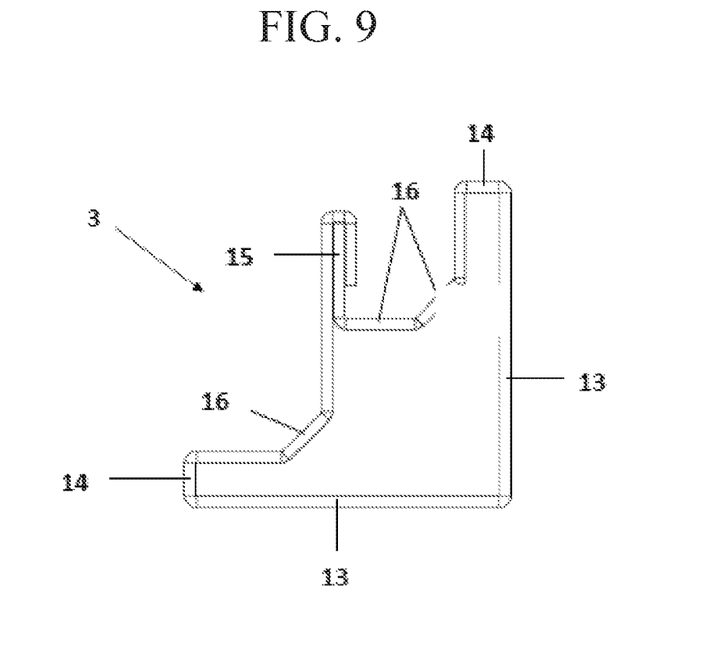
FIG. 9 shows a front view of a vertical profile.
Figure 10:
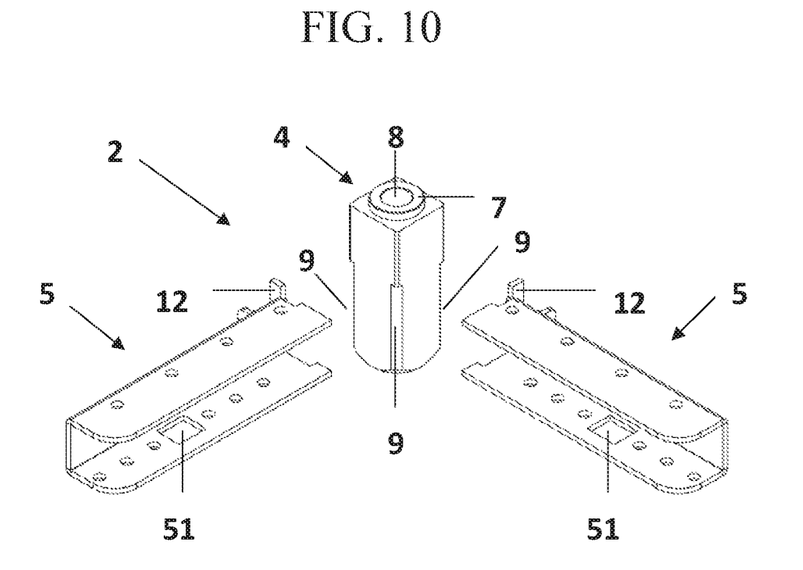
FIG. 10 shows an exploded front view of a fitting element.
Figure 11:
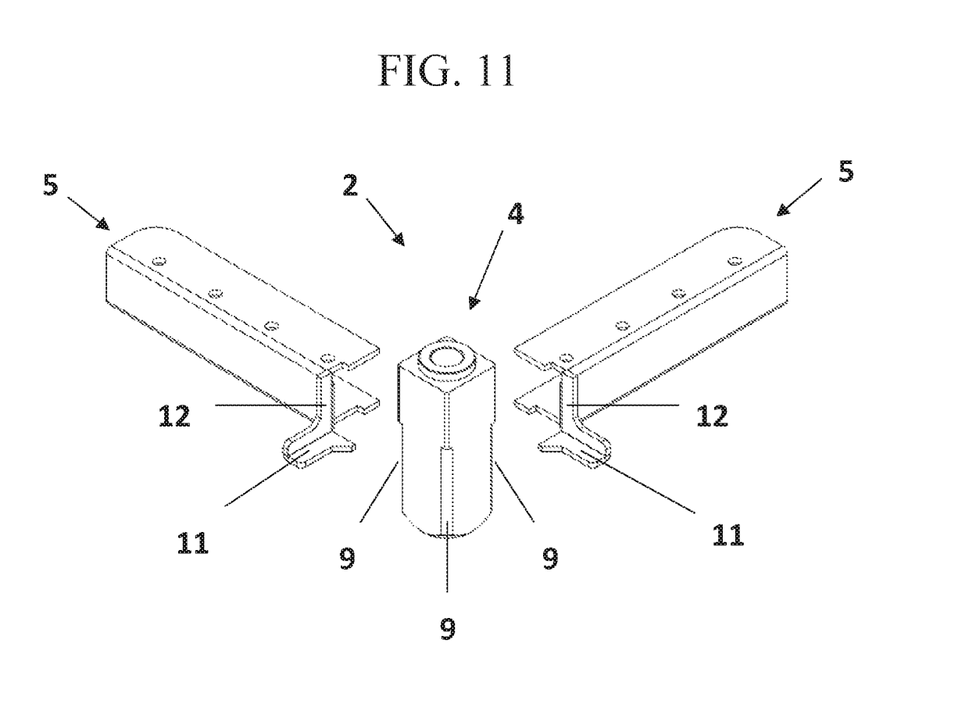
FIG. 11 shows an exploded rear view of a fitting element.
Figure 12:
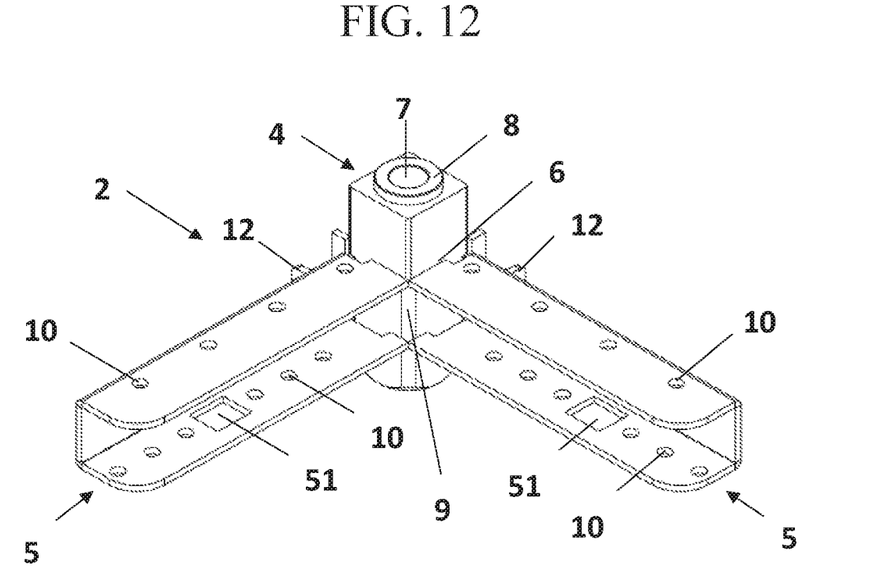
FIG. 12 shows a front view of a fitting element.
Figure 13:
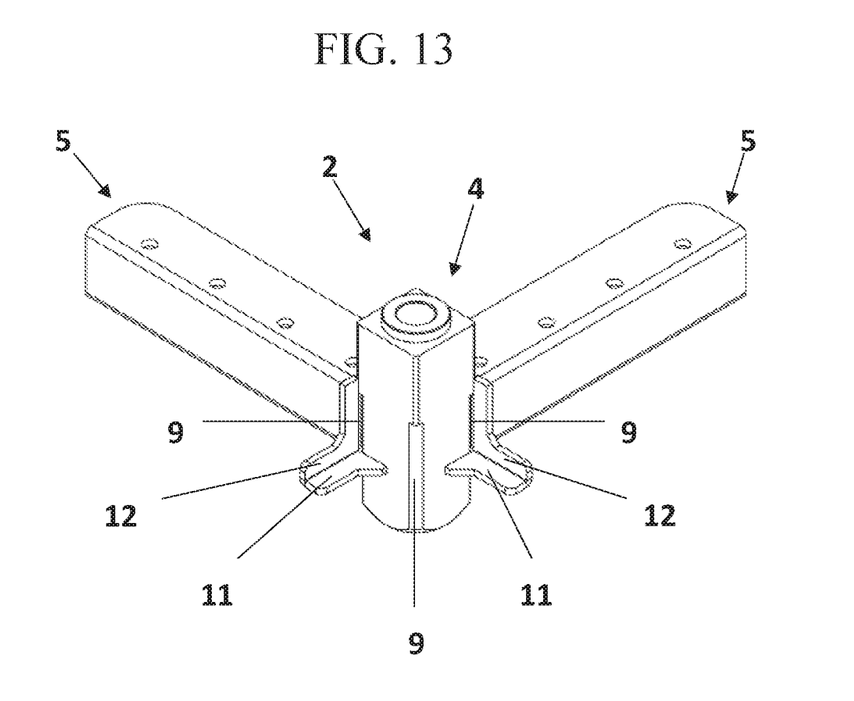
FIG. 13 shows a rear view of a fitting element.

The vertical profile (3) component part of the structural columns (1) comprises a closed tubular profile with two sides (13) at right angles, which have rectangular frames (14) at their ends. Closure of the closed tubular profile is accomplished by a central flap (15) located between the rectangular frames (14) and connected thereto by means of intermediate regions (16). In its preferred configuration, the central flap (15) faces the exterior of the modular structure (19). Along its length, the vertical profiles (3) have a number of bores (17) evenly distributed in the central flaps (15) and on the sides (13), right-angled, which enables various configurations in the electric assembly, being such bores circular, rectangular and square.

In the manufacture of a structural column (1), two fitting elements (2) are symmetrically attached to the ends of a vertical profile (3) by means of welds (18) made in the contacts between the parts, particularly in the contact between the positioning flap (11) and the intermediate regions (16) and between the limiter (12) and the structural dowel (4).

The welds made on the structural column (1) guarantee excellent mechanical strength to the part and consequently to the modular structures (19) assembled from said structural columns (1).

Figure 21:
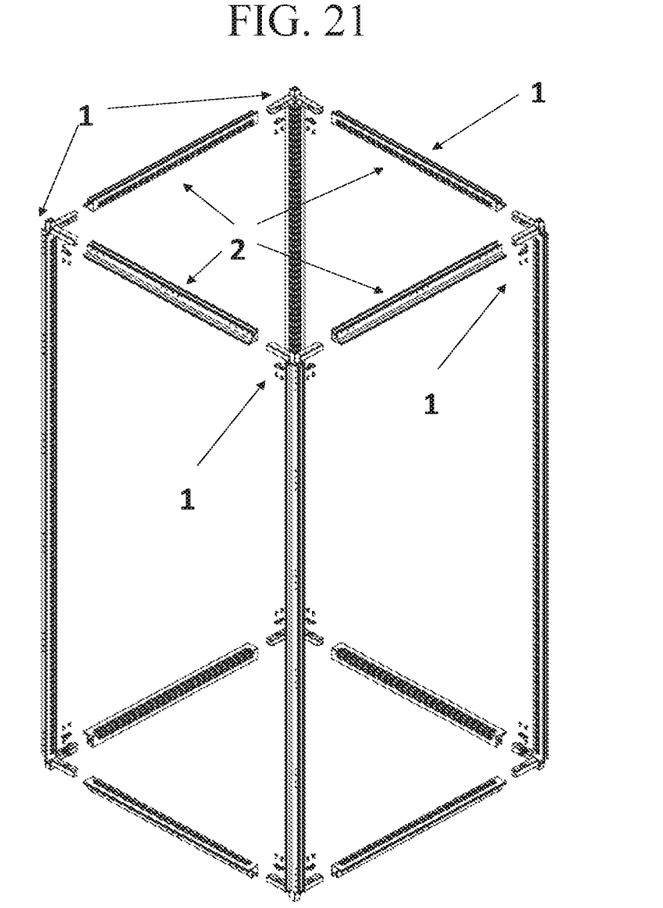
FIG. 21 shows an exploded view of the modular structure.
Figure 22:
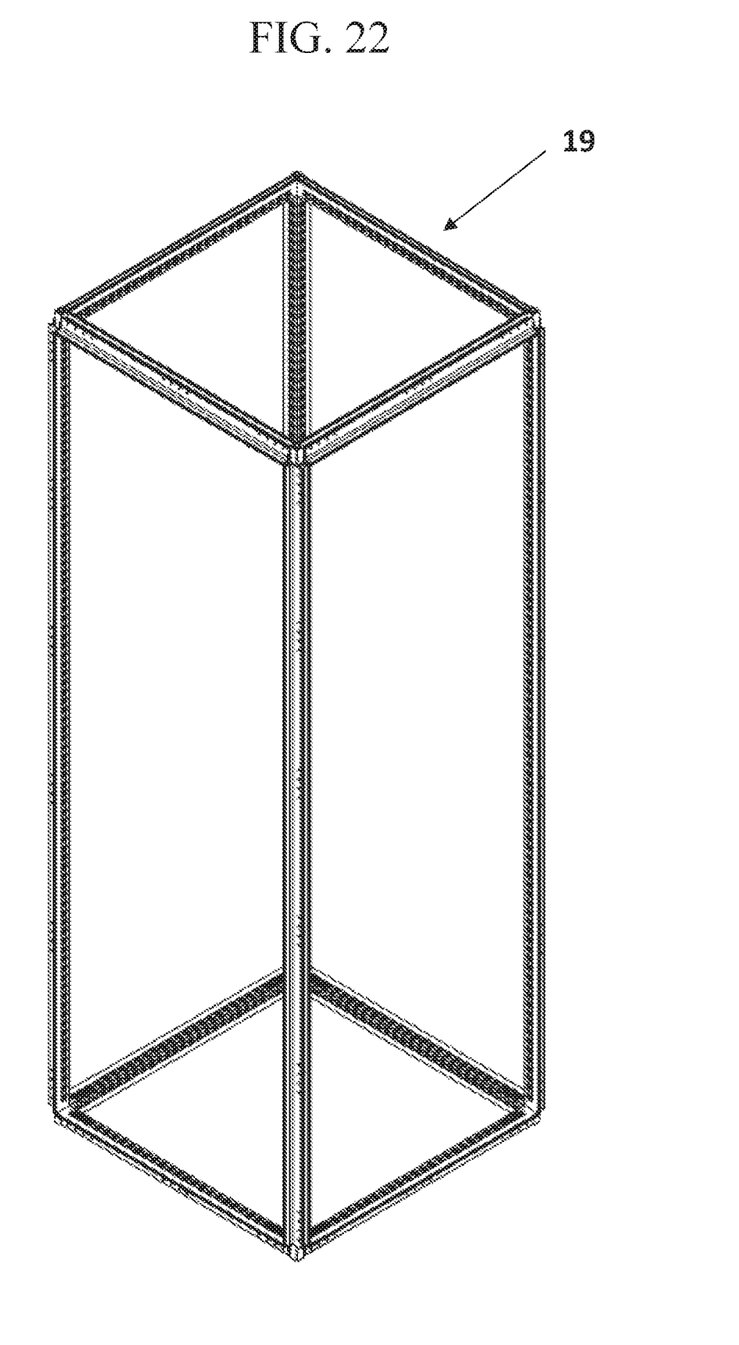
FIG. 22 shows a view of the assembled modular structure.

The modular structure (19) itself comprises at least four structural columns (1) and at least eight horizontal beams (20), connected to each other by means of screws (21) positioned in the bores (10, 27) of the coupling elements (5) and of the horizontal beams (20), respectively. The connection between a structural column (1) and two horizontal beams (20) is made by at least sixteen and at most thirty-two screws (21), according to the specifications of each electrical cabinet design. Alternatively, rivets or other fastening means may be used.

The horizontal beams (20) comprise closed tubular profiles of geometry similar to the vertical profiles (3), containing several evenly distributed bores, such bores being circular, rectangular and square; with the face (22) and the underside (23) forming a right angle. However, while one side has a rectangular frame (24) at its end, the other has an outer flap (25), by means of which the closed tubular profile is closed. Between the rectangular frame (24) and the outer flap (25), there is a flat region (26) perpendicular to said outer flap (25). The lower face (23) and the flat region (26) of a horizontal beam (20) have bores (27) corresponding to the bores (10) of the coupling elements (5).

The welds (6, 18) made on the column (1) are made by electric arc welding processes.

All components of the modular structure (19), i.e., the structural columns (1), horizontal beams (20) and screws (21) are metallic, manufactured from metal alloys of carbon steel.

In its preferred configuration, the modular structure (19) has a parallelepipedal shape and constitutes the means for supporting and assembling various components of an electrical cabinet, such as assembly plates, doors, locks, base, assembly plates, buttons, mechanical, electrical, and electronic devices, among others.

Advantageously, the present invention introduces a modular structure (19) whose corner joints are already completely integrated into the profiles of height by means of structural columns (1). The mechanical strength and stability provided by this innovative configuration allows the modular structure (19) to securely support all the component elements of an electrical cabinet, which often present severe operating conditions, particular high currents and temperatures.

Another advantage present in the modular structure (19) lies in the possibility of its being entirely manufactured with low-cost metal alloys, compared to Zamak alloys commonly used by the state of the art. Thus, the manufacturing costs of electrical cabinets can be significantly reduced, maintaining the mechanical robustness and structural stability necessary for their operation.

Another technical advantage presented by the modular structure (19) introduced here consists of the versatility of its dimensions, since the structural columns (1) and the horizontal beams (20) can be dimensioned according to the need of each electrical cabinet design. In other words, the dimensions of width, depth and height are chosen according to each customer's need.

Yet another advantage of the present modular structure (19) is that it can be sold as an unassembled kit for example comprising structural columns (1), horizontal beams (20) and screws (21), allowing space savings in transportation and in its storage.

In general, it may be said that this invention surprisingly and unexpectedly unites the advantages of the current state-of-the-art solutions, i.e., the robustness of the welding and the practicality of the modular assembly, while overcoming, at the same time, its drawbacks.

It is to be understood that this description does not limit the application to the details described herein and that the invention is capable of other modalities and of being used or executed in a variety of ways within the scope of the claims. Although specific terms have been used, such terms should be interpreted in a generic and descriptive sense, and not for purposes of limitation.

What is claimed is:

1. A structural column, comprising:
   wherein two fitting elements (2) symmetrically attached to the ends of a vertical profile (3) by means of welds (18) made on the contacts between the parts, so as to form a single body in the contact between a positioning flap (11) and intermediate areas (16) and between a limiter (12) and a structural dowel (4);
   wherein each fitting element (2) of having the structural dowel (4) and two coupling elements (5) perpendicularly arranged in relation to the structural dowel (4);
   wherein in the fitting element (2), the two coupling elements (5) are attached to the structural dowel (4) by welds (6) made on the contact areas between said parts;
   wherein each of the coupling elements (5) comprises a "C" shaped, stamped part;
   wherein both the upper and lower faces of each of the coupling elements (5) has bores (10) evenly distributed along their length;
   at one end, one of the coupling elements (5) has an L-shaped positioning flap (11) coplanar with the lower face of said coupling element (5) and a limiter (12), also in "L" shape, perpendicularly arranged in relation to the positioning flap (11).

2. The structural column according to claim 1, wherein the welds (6, 18) made on the structural column (1) are made by electric arc welding processes.

3. The structural column according to claim 1, wherein a structural dowel (4) comprises a substantially parallelepipedal shaped piece, provided with a blind bore (7) in its upper portion; the region surrounding the blind bore (7) of the structural dowel (4) having a circular elevation (8); the lower portion of the structural dowel (4) has a flat face with rounded vertexes; the central portion of the structural dowel (4) has four engagers (9), that is, cuts at 45° which create compatible areas for accommodating the coupling elements (5); the engagers (9) are located on the vertical edges of the structural dowel (4).

4. The structural column according to claim 1, wherein the vertical profile (3) comprises a closed tubular profile with two right-angled sides (13), which have rectangular frames (14) at their ends; the closing of the closed tubular profile is carried out by a central flap (15) facing the outside of a modular structure (19) and located between the rectangular frame (14) and connected to these via intermediate areas (16); along its length, the vertical profiles (3) have several bores (17) evenly distributed in the central flaps (15) and sides (13) at right angles.

5. The structural column according to claim 1, wherein the positioning flap (11) and the limiter (12) must possess sufficient area for sealing the rectangular frames (14) of the vertical profiles (3).

6. The structural column according to claim 1, wherein the coupling elements (5) having, on their upper face, a square-shaped assembly slot (51), the latter being close to its central portion.

7. The structural column according to claim 6, wherein the assembly slot (51) having the function of receiving a communicating element (52), which has a lower assembly flap (53) and two assembly holes (54), opposite each other.

8. The structural column according to claim 7, wherein the communicator element (52) connects the horizontal beams (20) so that the lower assembly flap (52) fits in one of the respective square bores and consequently aligns from the rear fitting next to the assembly slot (51), the circular bores of the horizontal beams (20) to the bores of the coupling element (5).

9. A modular structure for electrical cabinet, having a structural column according to claim 1, the structural column has a parallelepipedal structure, which constitutes the means for supporting and assembling component elements of an electrical cabinet, characterized by the fact of it comprising four vertically positioned structural columns (1) and eight horizontal beams (20); the structural columns (1) and the horizontal beams (20) being connected together by means of screws (21); the horizontal beams (20) comprise closed tubular profiles, with the face (22) and the underside (23) forming a right angle; one of the sides has a rectangular frame (24) at its end, while the other has an outer flap (25), by means of which the closed tubular profile is closed; between the rectangular frame (24) and the outer flap (25) is a planar region (26) perpendicular to said outer flap (25); the lower face (23) and the flat region (26) of the horizontal beam (20) have bores (27) corresponding to the bores (10) of the coupling elements (5) of the structural columns (1).

10. The structural column according to claim 9, wherein the connection between a structural column (1) and two horizontal beams (20) is made by at least sixteen and at most thirty-two screws (21).

11. The structural column according to claim 9, wherein a connection between the structural columns (1) and the horizontal beams (20) is made by rivets.

12. The structural column according to claim 9, wherein the positioning flap (11) and the limiter (12) must possess sufficient area for sealing the rectangular frames (24) of the vertical profiles (20).

13. The structural column according to claim 9, wherein all components of the modular structure (19) are metallic, made from alloys selected from a group comprising carbon steel and high speed steel.

14. The structural column according to claim 4, wherein the positioning flap (11) and the limiter (12) must possess sufficient area for sealing the rectangular frames (14) of the vertical profiles (3).

* * * * *